United States Patent
Fay et al.

(10) Patent No.: US 7,087,352 B2
(45) Date of Patent: Aug. 8, 2006

(54) AUTOMATED OVERLAY METROLOGY SYSTEM

(75) Inventors: Bernard Fay, Los Gatos, CA (US); Arun A. Aiver, Fremont, CA (US)

(73) Assignee: Nikon Corporation, Tokyo (JP)

( * ) Notice: Subject to any disclaimer, the term of this patent is extended or adjusted under 35 U.S.C. 154(b) by 54 days.

(21) Appl. No.: 10/704,979

(22) Filed: Nov. 12, 2003

(65) Prior Publication Data

US 2004/0109165 A1 Jun. 10, 2004

Related U.S. Application Data

(63) Continuation of application No. 09/881,026, filed on Jun. 15, 2001, now abandoned.

(51) Int. Cl.
*G03C 5/00* (2006.01)
*G03F 9/00* (2006.01)

(52) U.S. Cl. .......................................... 430/22; 430/30
(58) Field of Classification Search ................... 430/22, 430/30
See application file for complete search history.

(56) References Cited

U.S. PATENT DOCUMENTS 5,989,761 A    11/1999  Kawakubo et al. ........... 430/22
6,699,624 B1 *  3/2004  Niu et al. ....................... 430/5

FOREIGN PATENT DOCUMENTS

| JP | 2001-272208 | 10/2001 |
| WO | WO 02/25723 | 3/2002 |
| WO | WO 02/069390 | 9/2002 |

OTHER PUBLICATIONS

Article titled "Light Diffraction Based Overlay Measurement"; J. Bischoff et al. dated 2001.
Article titled "Diffractive techniques for lithographic process monitoring and control"; S. Sohail et al. dated 1994.
Article titled "Specular Spectroscopic Scatterometry in DUV Lithography"; Nickhil et al. dated Mar. 1999.

* cited by examiner

*Primary Examiner*—Christopher G. Young
(74) *Attorney, Agent, or Firm*—Whitham, Curtis & Christofferson, P.C.

(57) ABSTRACT

Non-imaging measurement is made of misalignment of lithographic exposures by illuminating periodic features of a mark formed by two lithographic exposures with broadband light and detecting an interference pattern at different wavelengths using a specular spectroscopic scatterometer including a wavelength dispersive detector. Misalignment can be discriminated by inspection of a spectral response curve and by comparison with stored spectral response curves that may be empirical data or derived by simulation. Determination of best fit to a stored spectral curve, preferably using an optimization technique can be used to quantify the detected misalignment. Such a measurement may be made on-line or in-line in a short time while avoiding tool induced shift, contact with the mark or use of a tool requiring high vacuum.

9 Claims, 7 Drawing Sheets

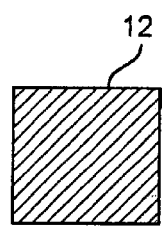
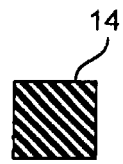
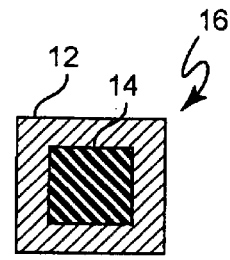
FIGURE 1A          FIGURE 1B          FIGURE 1C
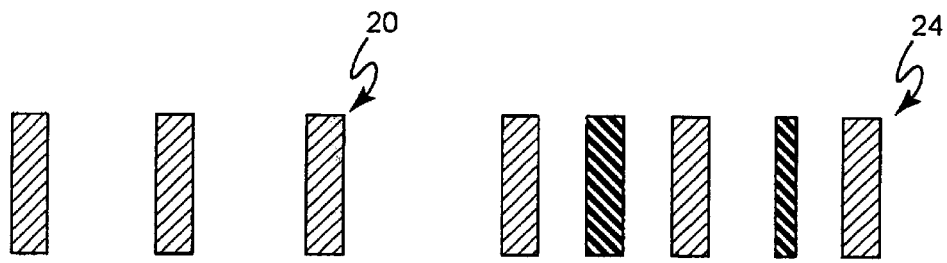
FIGURE 2A
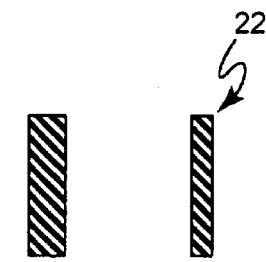
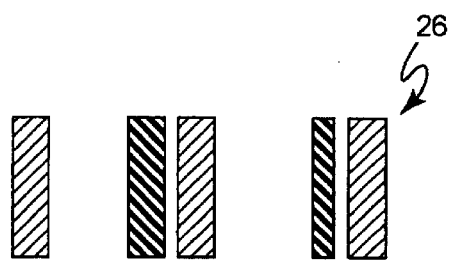
FIGURE 2          FIGURE 2B

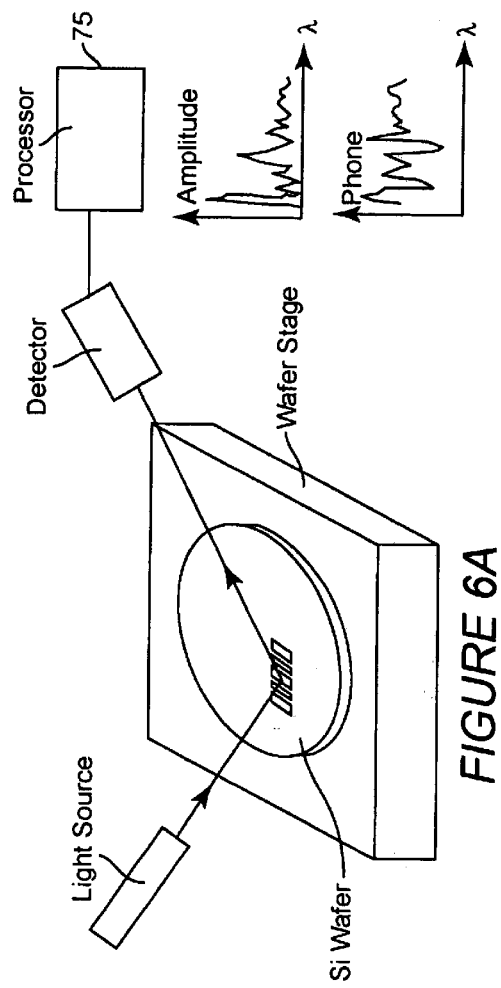
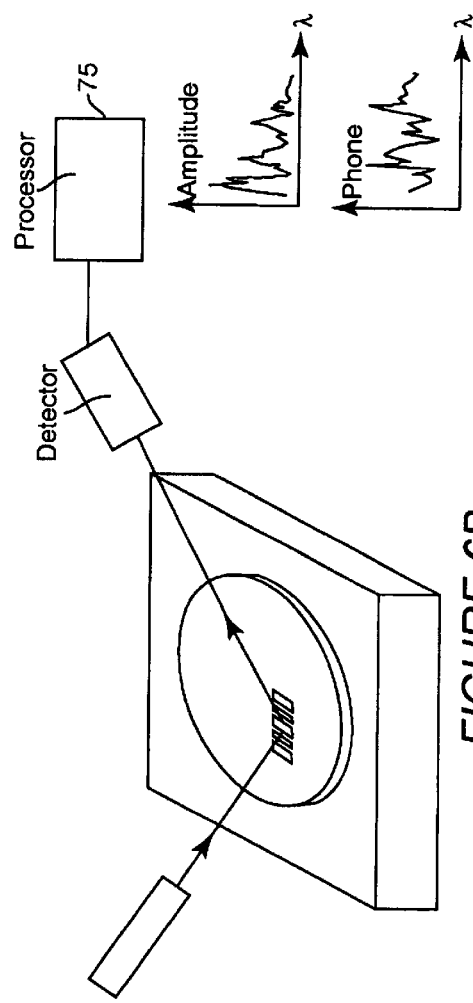

AUTOMATED OVERLAY METROLOGY SYSTEM

This application is continuation of U.S. patent application Ser. No. 09/881,026, filed Jun. 15, 2001, now abandoned.

BACKGROUND OF THE INVENTION

1. Field of the Invention

The present invention generally relates to multiple sequential lithography processes and, more particularly, to metrology techniques for measurement and characterization of overlay and alignment accuracy for sequential lithographic exposures and in-line and on-line lithographic exposure, scanner or stepper tools.

2. Description of the Prior Art

Lithography processes are currently used in many research and manufacturing environments. Among these environments, one of the more economically important is that of semiconductor integrated circuit manufacture. In this field, increased functionality, performance and potential economy of manufacture has driven the development of numerous successive generations of devices having minimum feature size regimes of increasingly small dimensions and correspondingly increased device density. Currently, feature size regimes of one-quarter micron are available in commercial devices with significant further reductions of minimum feature size foreseeable or in experimental stages of development.

While sophisticated processes have been developed allowing production of structures much smaller than can be resolved by known lithographic processes, it can be understood that at least one lithographic process is required to establish the location and basic dimensions of various electronic devices (e.g. transistors, capacitors and the like) on the wafer and chip areas thereof. However, as a practical matter, numerous lithographic exposures and processes are generally required since formation of devices in different areas and different layers are generally included in current and foreseeable designs.

For example, at extremely small minimum feature size regimes, if different structures of a particular device, such as the gate and channel of a field-effect transistor must be formed with different lithographic processes, overlay accuracy must be maintained at a high level to avoid significantly altering electrical characteristics of the device. In much the same manner, interlayer connections (e.g. vias, studs and interconnect layer patterns) must be overlaid on each other with extreme accuracy in order to reliably and repeatably form low resistance connections which will remain reliable when placed in service. The accuracy of positioning in all of these circumstances will hereinafter be referred to as overlay accuracy.

It has been observed that integration density in successive generations of integrated circuits roughly doubles every two to three years. This increase in integration density corresponds to a reduction of minimum feature size of about 30% over similar periods. The overlay accuracy requirement must be held to a fraction (generally about one-third or less) of the minimum feature size to maintain device geometry and connection reliability. To maintain such accuracy, overlay and stitching measurement accuracy (mean value plus or minus 3 sigma) must be maintained to a metrology error budget of about 10% or less of the maximum allowable overlay error or about 3% of the minimum feature size (less than 6 nm for 0.18 micron minimum feature size technology).

Commonly used metrology techniques are based upon optical microscopy observation of overlay targets for quantifying the overlay error. These techniques have relied upon a feature-in-feature imaging process where a feature such as a square or line is formed within another generally similar shape (e.g., box-in-box or line-in-line) to define the overlay target. The smallest feature size of the overlay target is typically of the order of 1 micron, so that it can be imaged with high contrast, well within the resolution limit of a conventional optical microscope.

Measurement of these overlaid features with, for example, a scanning electron microscope (SEM) of atomic force microscope (AFM) has allowed measurement data to be developed which can be processed to provide measurement resolution somewhat greater than the resolution of available lithography tools, even though the features measured are typically larger than the features which can be lithographically resolved. However, such measurement techniques require complex and expensive SEM or AFM tools which are inherently of low throughput and the measurement is necessarily destructive, decreasing manufacturing yield.

Perhaps more importantly, decreases in minimum feature size and increases in integration density have required increasingly complex, expensive and difficult to use measurement tools while measurements produced are of reduced repeatability, reproducibility, tool induced shift (which are the principal components of the metrology error budget) and quantitative certainty (e.g. confidence factor) as limits of both lithographic and microscopic resolutions are approached, particularly when the imaged features measured are necessarily much larger than the minimum feature size. Further, it is not only necessary to quantitatively evaluate the positioning accuracy of overlaid or stitched together features, but the profile of the exposed and developed resist and/or lithographically produced structures must also be evaluated in separate measurements in order to assure that structures with the desired electrical properties are produced.

Thus, it is seen that, at the present state of the art, known overlay measurement techniques can only be extended to smaller regimes of feature size at relatively great tool expense and process difficulty and complexity and increasing uncertainty and decreasing repeatability of result. Further, it is not at all clear that advances in microscopy processes or other inspection devices which rely upon imaging of features will be able to support manufacturing processes of foreseeable regimes of integrated circuit feature size and integration density.

Spectroscopic reflectometry and spectroscopic ellipsometry are known and well-understood techniques for making quantitative observations of surfaces and structures but have only rarely been applied to lithographic processes or characterization of the performance of lithography tools. However, one such application is the use of specular scatterometry to provide a non-destructive measurement of profiles of resist grating patterns of high resolution. This was presented by Spanos and his students (X. Niu, N. Jakatdar) at the First Small Feature Reproducibility workshop (UC SMART Program Review, of which the assignee of the present invention is a funding participant), held at the University of California on Nov. 18, 1998. Spanos outlined plans to use a spectroscopic ellipsometry sensor to extract profiles of 180 nm and 150 nm linewidth resist features. FIG. 8, derived from that presentation shows spectral response curves of Log(Tan Ψ), the amplitude ratio of complex 0th order TE and TM reflectivities, for two sets of nominal linewidth features (250 nm and 100 nm) with ±7% variation linewidths. The result for the 100 nm feature shows a ±7% linewidth variation on a 100 nm nominal feature (or 7 nm) produces differing spectral curves that can be used to measure linewidth. However, it should be recognized that the curves are quite similar in shape since they are produced by regularly spaced features, and that both the shape of the spectral curves and the location of the various peaks and valleys can be used to evaluate the linewidth corresponding to a measured spectral curve, by best fit comparison to a library of spectral curves, previously generated by simulation and verified by comparison to calibration experimental data.

Specular spectroscopic ellipsometry measures the 0th order diffraction responses of a grating at multiple wavelengths and fixed incidence angle using a spectroscopic ellipsometer sensor. A description of the measurement technique can be found in the publication "Specular Spectroscopic Scatterometry in DUV Lithography" by X. Niu et al. (SPIE, Vol. 3677, pp. 159–168, March, 1999. The ellipsometer sensor measures complex reflectivity for two orthogonal light polarizations.

SUMMARY OF THE INVENTION

The meritorious effects of the invention include provision of an optical metrology technique which does not rely upon imaging of features for inspection, increased resolution and quantitative accuracy and repeatability which can be performed with apparatus of much reduced expense and complexity at greatly increased throughput, and simultaneous and non destructive overlay position and feature profile measurements.

In order to obtain these effects, a method and apparatus are provided which perform non-imaging metrology apparatus comprising storage of spectral curves, measurement with a specular spectroscopic scatterometer of reflection from a plurality of marks formed by two lithographic exposures and forming a periodic structure, and providing comparison of processed signals output from said specular spectroscopic scatterometer with said spectral curves to evaluate misalignment of said two lithographic exposures.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A, 1B and 1C are illustrations of a box-in-box image used in known metrology techniques, FIG. 2 shows respective feature levels in accordance with a preferred form of the invention, FIG. 2A shows the images of the features of FIG. 2 overlaid in desired alignment, FIG. 2B shows the images of the features of FIG. 2 overlaid with misalignment.

FIG. 6A is a schematic diagram of the measurement apparatus in accordance with the invention, including a spectroscopic reflectometer sensor and detector and a wafer with composite overlay targets with exact alignment, FIG. 6B is a schematic diagram of the measurement apparatus in accordance with the invention, including a spectroscopic reflectometer sensor and detector and a wafer with composite overlay targets with some misalignment.

DETAILED DESCRIPTION OF A PREFERRED EMBODIMENT OF THE INVENTION

Figure 3:
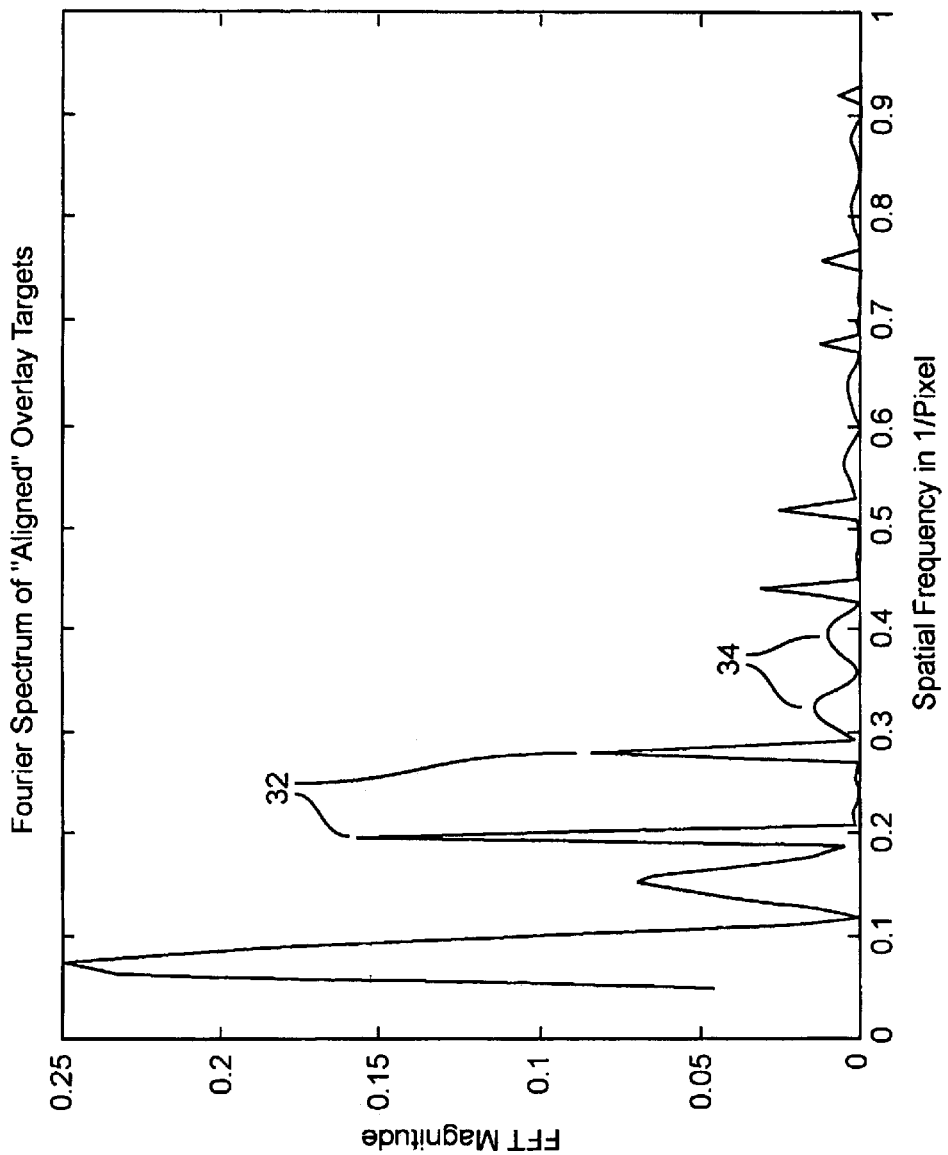
FIG. 3 shows a simulated Fourier spectrum developed in accordance with the invention and corresponding to FIG. 2A (correct alignment)

Referring now to the drawings, and more particularly to FIGS. 1A, 1B and 1C, there is shown a typical box-in-box metrology feature exemplary of features for such purposes-known and used in the art. The box-in-box feature 16 shown in FIG. 1C is a composite feature formed by two overlaid lithographic exposures corresponding respectively to features 12 and 14 of FIGS. 1A and 1B, respectively, which are generally sequentially performed and each preceded by deposition of a layer of resist and followed by development of resist layer and possibly including etching or material deposition processes between the lithographic exposures. One feature will be larger than the other and the smaller feature should be of dimensions which, ideally, closely approach the minimum feature size of interest.

At the present state of the art, however, the smaller and larger features are generally produced with a transverse dimension of the order of a few microns. Such dimensions are about an order of magnitude or more larger than minimum feature size of the current generation of commercially available integrated circuits. Such a difference in minimum feature size puts stringent demand on processing of measurement data to hold the overlay accuracy budget within a small fraction of the minimum feature size and may provide profile shapes which are not representative of the profiles of much smaller features. The relative positions of these features and their material profiles must then be observed by optical microscopy, SEM or AFM in separate processes and the resulting data processed. All of these processes are imaging techniques and all have serious limitations. The optical microscopy method is limited in image resolution. The AFM method is a quasi-contact technique and is very slow. The SEM method requires that observation be performed in a high vacuum and transfer of the wafer and pumping an expensive vacuum chamber down to an appropriate pressure greatly extends the amount of time required for measurement to be made; which is, itself, of significant duration of about ten seconds or more per measurement. It may be required for the wafer to be sectioned and illuminated at different angles requiring different set-up for different measurements. In any case, measurement is destructive, indirect and of necessarily low throughput while requiring apparatus and process methodology of high (and increasing) complexity and cost as well as substantial processing of the raw measurement data.

FIG. 2 shows two levels 20, 22 of exemplary features in accordance with the present invention. In theory, any series of repeated shapes with intervening repeated shapes in another level could be used in accordance with the basic principles of the invention. However, arrays of lines (which can be relatively short) are preferred to minimize data processing complexity and time. Further, while it is contemplated that the invention would preferably be practiced using test patterns similar to those of FIG. 2 and in which one level (sequentially second) was formed of resist, longer lines may provide enhanced signal-to-noise ratio or other improvement in raw data and it should be understood that the invention can be practiced with completed structures such as relatively long parallel connections (and which may include angled portions). It is preferred that the two arrays of features be similarly and regularly spaced (e.g. of constant pitch/spacing) and of the same width but different widths and spacing can be accommodated and, moreover, accurately evaluated by the practice of the invention.

The exposures of the respective level patterns of FIG. 2 can be made in a manner which is fortuitously aligned, as shown at 24 in FIG. 2A, but will generally be misaligned to some degree, as shown at 26 in FIG. 2B. In accordance with the principles of the invention, the composite pattern in accordance with, for example, FIG. 2A or FIG. 2B will function as a diffraction grating and the respective features need not be specifically imaged in the course of the measurement process. By the same token and in accordance with the invention, restrictions on the illumination source by which the test pattern is observed are largely removed, greatly simplifying the required measurement apparatus and the process of its use while increasing throughput of the measurement process.

The theory and operation of a diffraction grating are well-understood and software exists which allows analysis and simulation of its effects which are extremely sensitive to geometry and spacing of the elements which comprise the periodic structure of a diffraction grating. Specifically, when a diffraction grating is illuminated at a known angle with either monochromatic (coherent or non-coherent) or broadband light, an interference pattern is developed by differences in opacity or reflectivity of respective areas therein. Depending on the geometry and spacing of the marks forming the diffraction grating, the interference pattern will exhibit specific and characteristic behaviors due to the interaction of the wavelengths of the illuminating radiation (e.g. light) and the spacing and other geometry of the marks which causes reflected or transmitted light at certain angles and wavelengths to be either reinforced or cancelled. Similar effects are observable with respect to phase and polarization of the transmitted or reflected radiation.

Measurement of amplitude and phase are generally referred to as spectroscopic reflectometry. Measurement of amplitude, phase and polarization are generally referred to as spectroscopic ellipsometry. Either may be used in the practice of the invention; the latter providing somewhat more detailed characterization of spacing and material profile but reflects additional "degrees of freedom" in the captured data. If spectroscopic reflectometry provides sufficient accuracy in determining misalignment error, then it is preferred for overlay metrology since less complex processing and/or matching of data is required. This would be the case when the overlay patterns have near ideal profiles of "square" profiles. In this case, it is necessary to model a large number of possible variations of the composite overlay structure and to build up a library of response curves which can be compared and matched to the measurement data.

However, if the profiles of the overlay patterns are rounded or distorted, the ellipsometry with its additional degrees of freedom can provide better accuracy in determining the misalignment error. In this case, it is necessary to model an even larger number of possible variations of the composite overlay structure and to build up a library of response curves which can be compared and matched to the measurement data. This library of response curves needs to be generated for each new situation of level-to-level overlay, for different degrees of misalignment error, profile distortion and using the measured optical constants of the substrate and layer materials. Fortunately, the wafer processes are very well characterized so that once the library is generated for a new situation, the misalignment error can be determined very rapidly by comparing stored spectra with the measured one.

FIGS. 6A and 6B illustrate the measurement geometry and apparatus in the case of reflecting aligned or misaligned overlay targets. For simplicity, a simple reflectometry sensor is shown. The measurement apparatus comprises a broadband light source producing a collimated light beam incident on the overlay target area at some fixed angle of incidence. The reflected light is collected by a wavelength dispersive detector that measures amplitude and phase of the reflected light across the desired spectrum. In FIG. 6A, the alignment of the second mask level to the first mask level is perfect and the composite overlay target produces a spectral response as shown. In FIG. 6B, the alignment is slightly off and a different spectral response is measured.

In both cases the spectral response is analyzed by a dedicated computer, compared to stored signals and the misalignment error, if any, is determined. Because the dimension of the individual overlay target can be small (such as one micron or less), the accuracy of the determination of the alignment error can be very high. Other advantages are speed (because signal processing is limited to comparison of the measured spectral curve to stored data and determination of best fit or match), the avoidance of a need for imaging, freedom from tool induced shift error and non-contact operation.

The optical spectroscopic reflectometry or ellipsometry sensor is very compact and can therefore be incorporated in a process tool such as a resist track developer to provide on-line metrology capability where it can provide direct feedback on the alignment system performance of the stepper. The same sensor could also be central to a stand-alone overlay metrology tool for in-line metrology applications.

Figure 4:
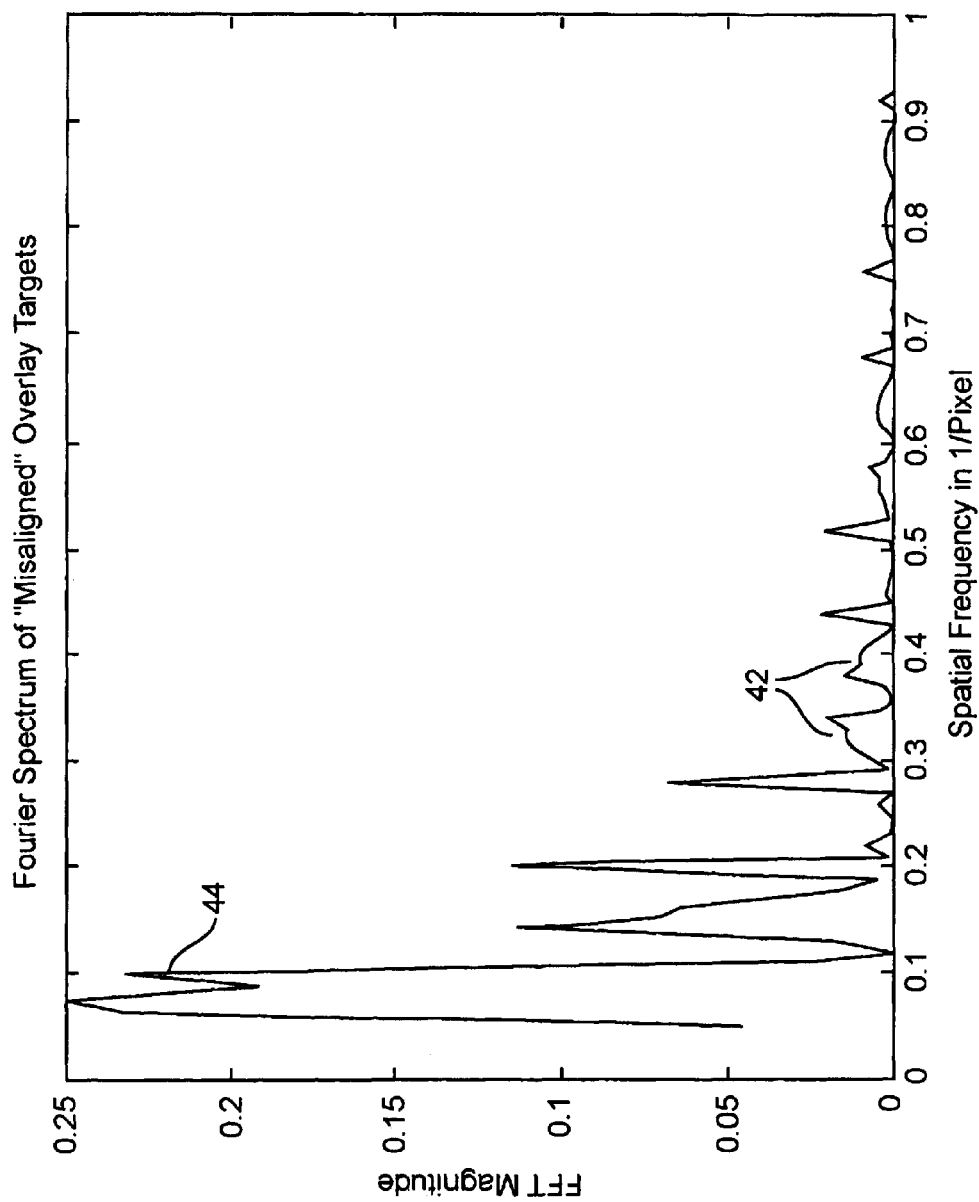
FIG. 4 shows a simulated Fourier spectrum developed in accordance with the invention and corresponding to FIG. 2b (misalignment)

A simulation of the FFT amplitude variation of spectral reflectance data from the pattern of FIG. 2A is shown in FIG. 3 and a simulation of FFT amplitude variation of spectral reflectance data from the pattern of FIG. 2B is shown in FIG. 4. It is assumed for purposes of this discussion that the differently shaded portions 22, 24 of FIGS. 2A (and 2B) have different reflectivity and that the marks include at least one mark which is of differing width. It is also assumed that illumination is with broadband light and that the reflected light is analyzed with a wavelength dispersive detector to provide a spectral curve of reflectivity (amplitude and phase) as a function of wavelength. The resulting curve will be similar in some respects to FIGS. 3 and 4 and can be processed to obtain the same overlay alignment information, as will be readily understood by those skilled in the art. The correctly aligned marks of FIG. 2A are assumed to be of substantially constant pitch while two (or more) distinct pitches or spacings are exhibited by the misaligned marks of FIG. 2B.

FIG. 3 shows a plurality of peaks of light amplitude at different frequencies or wavelengths (calibrated as a function of 1/pixel which is basically equivalent to inverse wavelength but specifically related by the calibration to multiples of lithographic tool resolution or minimum feature size). Sharp peaks 32 and broad peaks 34 are evident and are dependent on incident geometry, reflectivity and profile of individual lines. In FIG. 3, both the sharp peaks and the broad peaks are substantially symmetrical while in FIG. 4, substantial asymmetry is evident, particularly in the broad peaks 42 and the sharp peaks 44 of longer wavelength. This asymmetry of peaks in FIG. 4 is due to the different spacings caused by misalignment in the composite pattern of FIG. 2B but is substantially absent from FIG. 3 since the pitch of the marks is substantially constant. Thus, it is seen that the shape of the spectral curve is extremely sensitive to the existence of slight variation in spacing of a periodic structure (which would include features at a plurality of pitches or periodic spacings due to any misalignment) and even small degrees of misalignment can be discriminated by inspection and quantified by comparison with empirical or simulated data.

Figure 5:
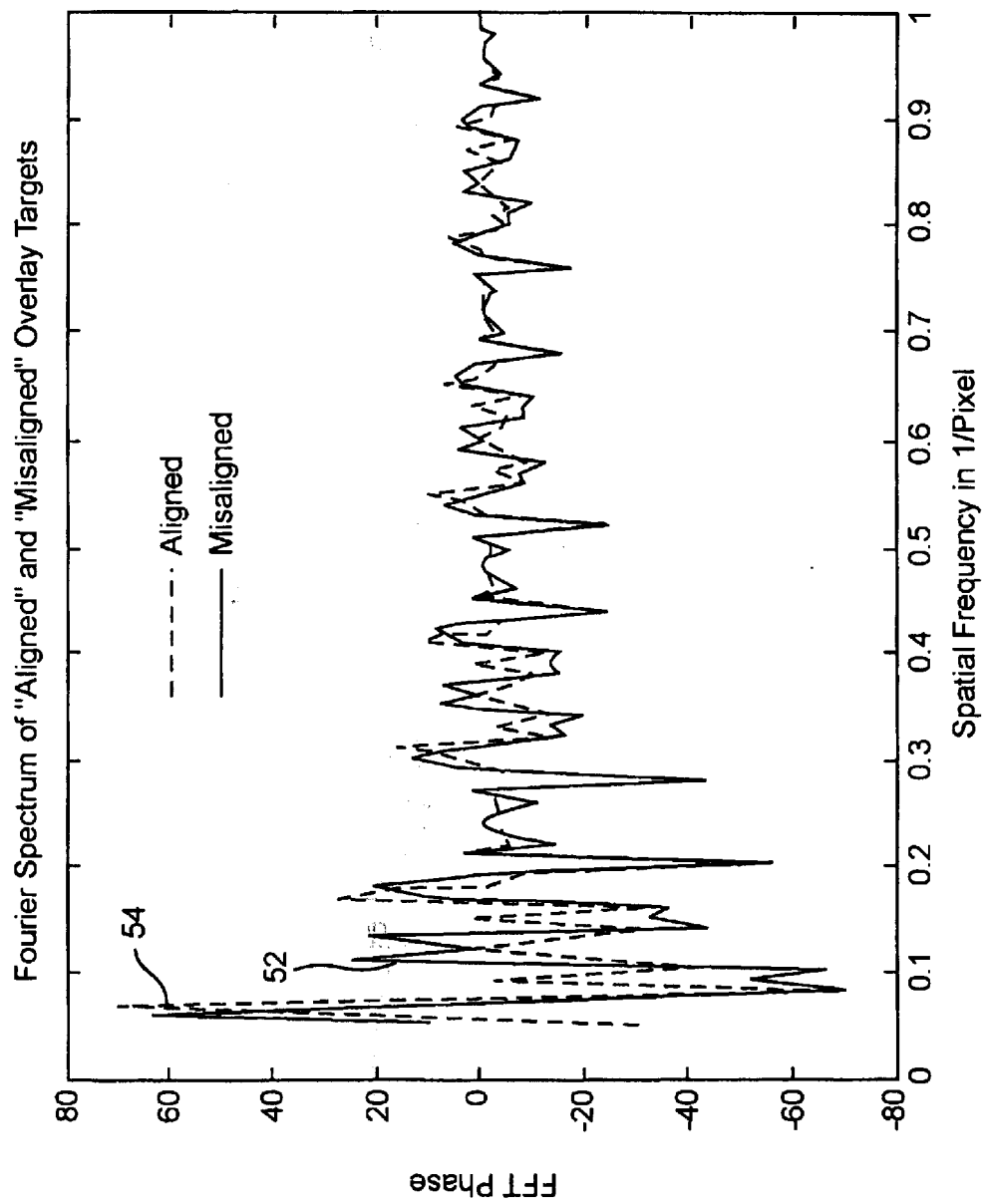
FIG. 5 shows a simulated Fourier phase spectrum developed in accordance with the invention with aligned and misaligned responses in accordance with the invention overlaid on each other.

FIG. 5 shows a simulation of phase variation with wavelength including two traces. The solid trace 52 corresponds to the aligned overlay pattern of FIG. 2A while the dashed trace 54 corresponds to slight misalignment. It should be noted that both the functional variation (e.g. trace shape) with wavelength and the magnitude of the variation varies with the degree of misalignment and is thus, like amplitude variation with wavelength of FIGS. 3 and 4, a very sensitive quantitative indicator of the degree of misalignment, after processing.

It is desirable to develop a quantitative measurement of overlay misalignment so that correction can be made or a decision can be made as to whether or not overlay accuracy is sufficient for processing to continue. (If the measurement is made including a previously formed structure and a developed pattern of resist, if the overlay misalignment is unacceptably great, the developed resist can be stripped and another resist layer applied, exposed and developed; thus saving the previous manufacturing expenditure of processing the wafer to that point. This savings may be substantial since many critical lithographic patterning processes are performed in making connections to devices after processes for forming those devices are substantially complete.) While the degree of asymmetry or phase function with overlay misalignment distance may be affected by other parameters such as mark size and profile, particularly if spectroscopic ellipsometry techniques are employed, the change in asymmetry or phase function with change in overlay misalignment can be characterized and are incorporated in the library data.

Therefore, for a given feature size regime and with at least some similarity in feature geometry (e.g. pitch, width and profile) a calibration or verification of the process in accordance with the invention may be achieved by exposing overlaid patterns as described above in connection with FIGS. 2, 2A and 2B with differing misalignments and making spectroscopic observations such as FIGS. 3 and 4, followed by processing of the spectral curves and comparison to stored curves obtained from prior simulations to determine the misalignment errors. The same patterns can then be observed or measured with SEM or AFM and the results compared to the calculated misalignments. If the results do not agree, then it may be necessary to perform additional simulations to better model the composite overlay target physical properties using SEM cross-sectional data.

Figure 7:
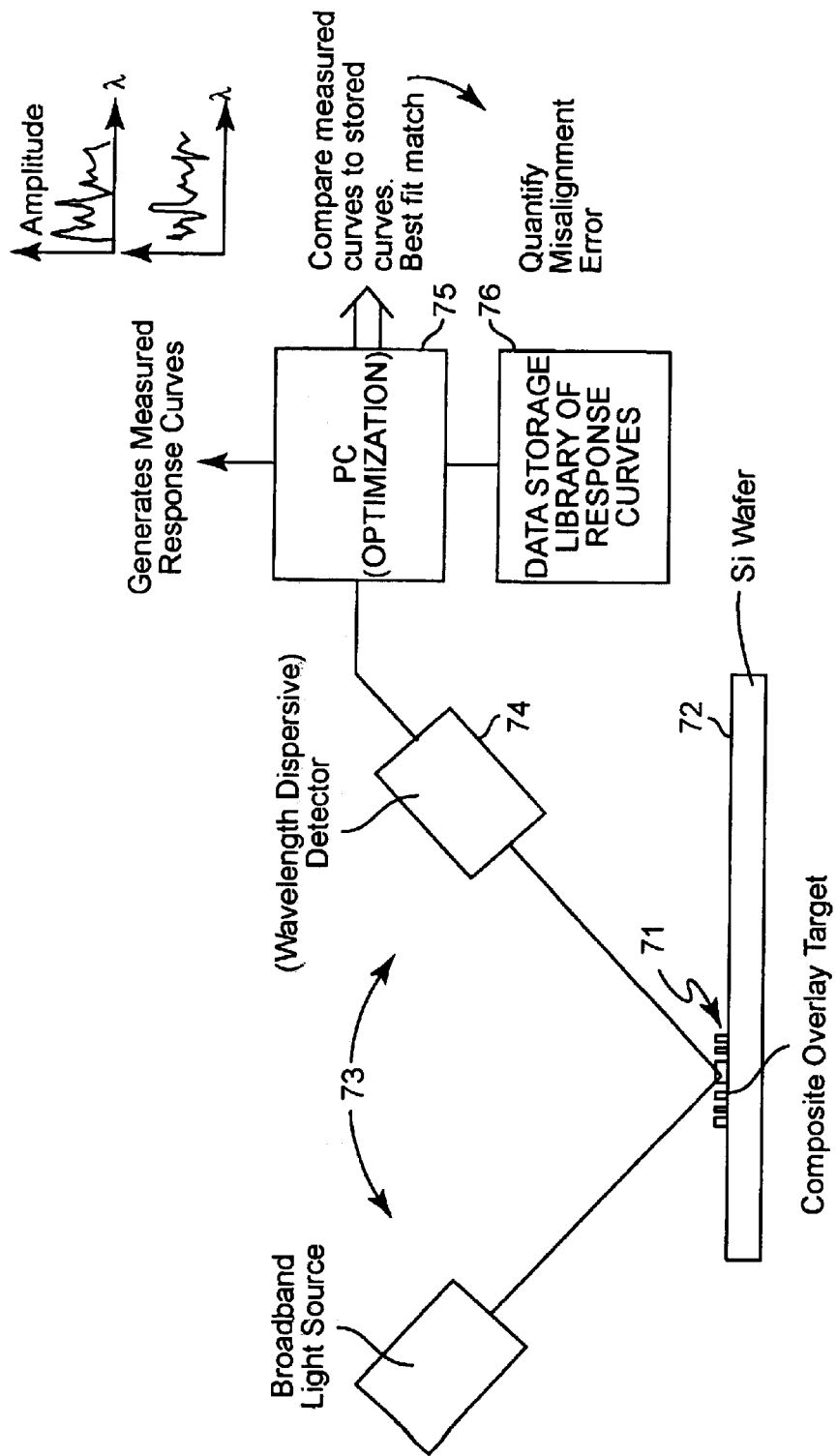
FIG. 7 is a schematic illustration of the measurement process in accordance with the invention.
Figure 8:
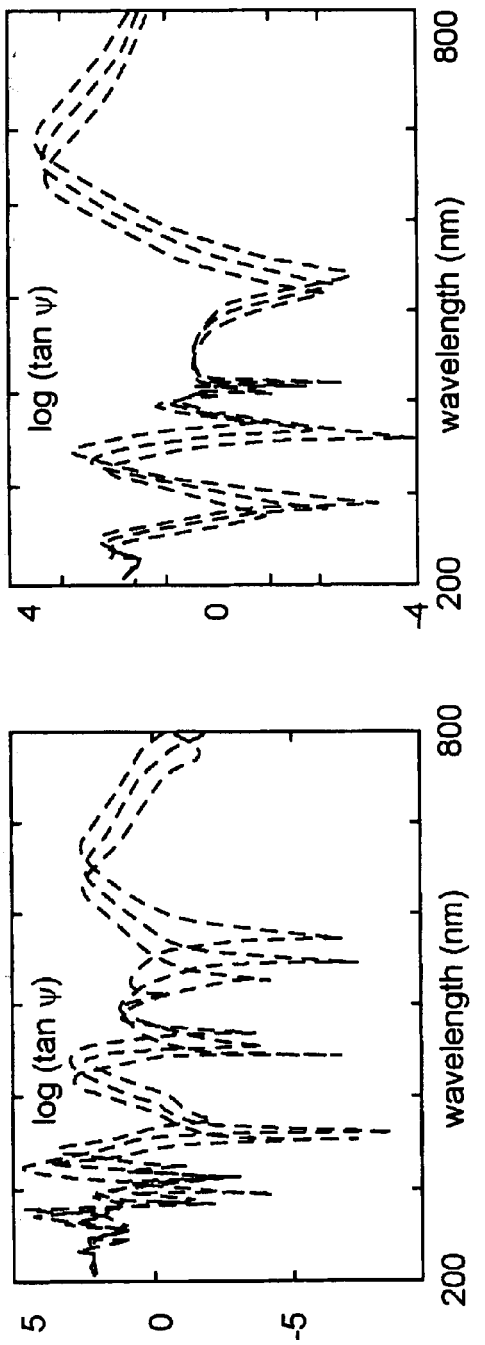
FIG. 8 is an illustrative chart from a presentation by Spanos, Niu and Jakatdar at the First Small Feature Reproducability workshop.

Referring now to FIG. 7, the methodology of the invention will now be summarized. Composite overlay targets 71 are obtained by superimposition of two successive mask level patterns in a reserved area of the wafer 72, referred to as an overlay measurement mark area, The second mask level is defined as a resist structure and the first mask level is defined as an etched structure on the same area of the wafer substrate.

The wafer is brought under a specular spectroscopic scatterometer 73 of either reflectometer or ellipsometer type which is used to analyze the composite overlay target. Measurement data (and amplitude and phase spectral curves) collected by a wavelength dispersive detector 74 are processed by a data processor 75, such as a workstation computer since processing power demands may be high for running an optimization program for matching measured data to stored data in a library 76 obtained by prior simulation with an exact model representation of the composite target structure for a full range of misalignment values. A global optimization technique is used to determine the best fit to modeled data and to thus quantify the misalignment value for the target.

In view of the foregoing, it is seen that the invention provides a technique of measuring overlay misalignment which does not require imaging of overlaid features and is thus applicable to feature sizes well below one micron. The invention provides improved resolution, repeatability, reproducibility and quantitative accuracy using simplified apparatus and procedures of reduced complexity and cost and which can be performed on-line or in-line, possibly concurrently with other measurements of interest. The invention utilizes an optical technique but, since it does not require imaging and avoids the need for a microscope, it is free from tool induced shift error (which is a measure of the impact of tool asymmetry on measurement error in an imaging system). Further, the invention provides for quantitative measurement of misalignment determined from processing simple and direct observation of a spectroscopic response corresponding to a detected interference pattern using broadband illumination.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An exposure system comprising:
   an exposure apparatus having an alignment-system for a substrate;
   a process apparatus which processes the substrate; and
   a sensor which detects a reflected light generated from an illuminated overlay pattern formed on a substrate, wherein said sensor detects the reflected light using optical spectroscopic reflectometry or ellipsometry, and wherein the sensor is incorporated in said process apparatus.

2. The system as recited in claim 1, wherein a detecting result of said sensor is performed by direct feedback to said alignment-system.

3. The system as recited in claim 1, further comprising:
   a library which stores simulated spectral curves obtained in advance by simulation of plural pattern models whose structures are different from each other;
   wherein the exposure system obtains an alignment error of the overlay pattern by comparing a measurement result of a spectral curve detected by the sensor with said simulated spectral curves stored in the library.

4. An exposure system as recited in claim 1, wherein
   said overlay pattern is formed of two overlaid patterns which can be misaligned, and wherein
   amplitude and phase detected using said spectrographic reflectometry or amplitude, phase and polarization detected using said spectrographic ellipsometry at different wavelengths of radiation, by which said overlay pattern is illuminated, characterizes said misalignment.

5. An exposure system comprising:

an exposure apparatus having an alignment-system for a substrate; and a stand-alone overlay metrology apparatus which performs in-line metrology so as to detect a reflected light generated from an illuminated overlay pattern formed on a substrate, wherein the stand-alone overlay metrology apparatus detects the reflect light using optical spectroscopic reflectometry or ellipsometry.

6. The system as recited in claim 5, further comprising:

a library which stores simulated spectral curves obtained in advance by simulation plural pattern models whose structures are different from each other;

wherein the stand-alone overlay metrology apparatus obtains an alignment error of the overlay pattern by comparing a measurement result of a spectral curve which is detected by said in-line metrology with said simulated spectral curves stored in the library.

7. An exposure system as recited in claim 5, wherein said overlay pattern is formed of two overlaid patterns which can be misaligned, and wherein amplitude and phase detected using said spectrographic reflectometry or amplitude, phase and polarization detected using said spectrographic ellipsometry at different wavelengths of radiation, by which said overlay pattern is illuminated, characterizes said misalignment.

8. A lithographic method including a step of performing a lithographic exposure using an exposure system comprising:

an exposure apparatus having an alignment-system for a substrate;

a process apparatus which processes the substrate;

a sensor which detects a reflected light generated from an illuminated overlay pattern formed on a substrate, wherein said sensor detects the reflected light using optical spectroscopic reflectometry or ellipsometry, and wherein the sensor is incorporated in said process apparatus; and a library which stores simulated spectral curves obtained in advance by simulation of plural pattern models whose structures are different from each other;

wherein the exposure system obtains an alignment error of the overlay pattern by comparing a measurement result of a spectral curve detected by the sensor with said simulated spectral curves stored in the library.

9. A lithographic method including a step of performing a lithographic exposure using an exposure system comprising:

an exposure apparatus having an alignment-system for a substrate;

a stand-alone overlay metrology apparatus which performs in-line metrology so as to detect a reflected light generated from an illuminated overlay pattern formed on a substrate, wherein the stand-alone overlay metrology apparatus detects the reflect light using optical spectroscopic reflectometry or ellipsometry; and a library which stores simulated spectral curves obtained in advance by simulation plural pattern models whose structures are different from each other;

wherein the stand-alone overlay metrology apparatus obtains an alignment error of the overlay pattern by comparing a measurement result of a spectral curve which is detected by said in-line metrology with said simulated spectral curves stored in the library.

* * * * *